(12) United States Patent
Lai et al.

(10) Patent No.: US 8,692,571 B2
(45) Date of Patent: Apr. 8, 2014

(54) APPARATUS AND METHOD FOR MEASURING DEGRADATION OF CMOS VLSI ELEMENTS

(75) Inventors: Fang-Shi Jordan Lai, Chia Yi (TW);
Chih-Cheng Lu, Tainan (TW); Yung-Fu Lin, Hsinchu (TW); Hsu-Feng Hsueh, Tainan (TW); Chin-Hao Chang, Hsinchu (TW); Cheng Yen Weng, Hsinchu (TW); Manoj M. Mhala, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 433 days.

(21) Appl. No.: 13/183,521

(22) Filed: Jul. 15, 2011

(65) Prior Publication Data
US 2013/0015876 A1   Jan. 17, 2013

(51) Int. Cl.
G01R 31/00 (2006.01)
G01R 31/319 (2006.01)
(52) U.S. Cl.
CPC .............................. G01R 31/31924 (2013.01)
USPC .................................................... 324/762.01
(58) Field of Classification Search
None
See application file for complete search history.

(56) References Cited

U.S. PATENT DOCUMENTS 5,999,011 A * 12/1999 Chu et al. .................. 324/762.09
6,476,632 B1   11/2002 La Rosa et al.
6,815,970 B2 * 11/2004 Rost et al. ................. 324/762.02
7,268,575 B1   9/2007 Chen et al.
7,820,457 B2   10/2010 Chen et al.
2005/0212547 A1   9/2005 Suzuki

OTHER PUBLICATIONS

Kuang, W., CMOS IC Design for Reliability: A Review, http://www.paper.edu.cn/index.php/default/en_releasepaper/downPaper/200911-598, Nov. 2009.
Bernstein, J.B. et al., "Electronic Circuit Reliability Modeling", Microelectronics Reliability, 2006, pp. 1-23.
"Hot carriers injection", from Wikipedia, 2011, http://en.wikipedia.org/wiki/Hot_carriers_injection, 3 pages.
"Semiconductor Device Qualification", http://theriac.org/DeskReference/viewDocument.php?id=6&Scope=journal&year=2006&Q=4, 11 pages.
Negative bias temperature instability, from Wikipedia, 2011, http://en.wikipedia.org/w/index.php?title=Negative_bias_temperature_instability&printable=yes.
"Time-dependent gate oxide breakdown", from Wikipedia, 2011, http://en.wikipedia.org/wiki/Time_dependent_gate_oxide_breakdown.
Kean, J. et al., "An All-In-One Silicon Odometer for Separately Monitoring HCI, BTI, and TDDB", IEEE Journal of Solid-State Circuits, Apr. 2010, 45(4): 817-829.
Kim, T. et al., "Silicon Odometer: An On-Chip Reliability Monitor for Measuring Frequency Degradation of Digital Circuits", IEEE Journal of Solid-State Circuits, Apr. 2008, 43(4):874-880.

* cited by examiner

*Primary Examiner* — Paresh Patel
(74) *Attorney, Agent, or Firm* — Duane Morris LLP

(57) ABSTRACT

The reliability of an integrated circuit is inferred from the operational characteristics of sample metal oxide semiconductor (MOS) devices switchably coupled to drain/source bias and gate input voltages that are nominal, versus voltage and current conditions that elevate stress and cause temporary or permanent degradation, e.g., hot carrier injection (HCI), bias temperature instability (BTI, NBTI, PBTI), time dependent dielectric breakdown (TDDB). The MOS devices under test (preferably both PMOS and NMOS devices tested concurrently or in turn) are configured as current sources in the supply of power to a ring oscillator having cascaded inverter stages, thereby varying the oscillator frequency as a measure of the effects of stress on the devices under test, but without elevating the stress applied to the inverter stages.

20 Claims, 10 Drawing Sheets

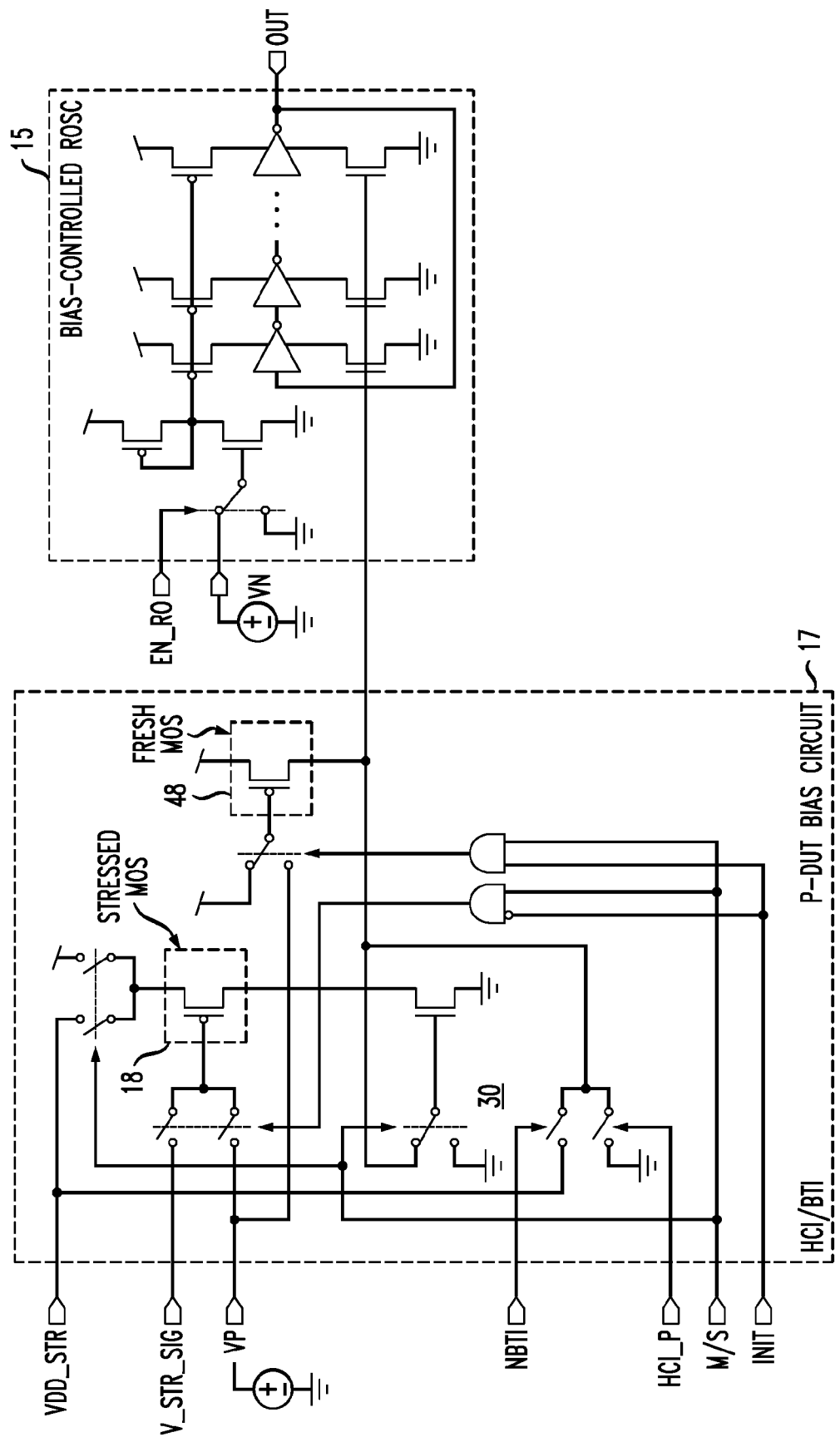

APPARATUS AND METHOD FOR MEASURING DEGRADATION OF CMOS VLSI ELEMENTS

BACKGROUND

This disclosure relates to assessing and forecasting the degradation of PMOS and NMOS circuit elements by comparing the operating characteristics of elements when stressed by voltage biasing conditions, versus operating characteristics of the same or other similar elements when not stressed.

Metal oxide semiconductor field effect transistors (MOSFET) are subject to physical effects that degrade operating characteristics, temporarily with stress or permanently due to accumulating effects of stress and/or operational conditions. In digital integrated circuits, the devices typically are provided in complementary MOS pairs with an NMOS element and a PMOS element coupled in series across a potential difference. One complementary element is conductive and the other nonconductive in any given logic state, which situation is reversed when switched to the other logic state. Although durable and long-lived as a class of devices, physical degradation of MOS devices occurs, and is a concern, particularly as the devices are scaled to very small dimensions in densely arranged integrated circuit designs.

Conditions leading to degradation can relate to gate bias voltage conditions and/or source/drain bias voltage conditions. Some physical effects that degrade MOS devices and receive attention due to design and reliability considerations are Hot Carrier Injection (HCI), Bias Temperature Instability (BTI), which is negative (NBTI) for PMOS devices and positive (PBTI) for NMOS), and Time Dependent Dielectric Breakdown (TDDB). Signs of degradation may include an increase in the threshold voltage of a device, progressively greater conductivity through the gate dielectric, changes in on or off current levels, etc.

Hot carrier injection (HCI) concerns the tendency of charge carriers flowing from source to drain to attain energy causing ionization and release of additional charge carriers, or causing some charge carriers to be injected into the dielectric layer by which the gate is insulated from the conduction channel between the source and drain. The charge carriers produce charge traps and material changes near the interface, leading to changes in performance characteristics such as threshold voltage, transconductance and/or saturation current. The rate of degradation due to hot carrier injection is a function of channel length, dielectric thickness and operational bias voltage.

Negative bias temperature instability (NBTI) is primarily a degradation effect for P-channel MOS transistors subjected to negative gate/substrate voltages. Holes are trapped at the interface between the gate oxide layer (typically SiO2) and the substrate (Si). This type of degradation decreases absolute drain current and transconductance. The absolute "off" current level and the threshold voltage are increased. There is a tendency for devices affected by NBTI to recover after stress is relieved.

One can also identify positive bias temperature instability (PBTI) in N-channel devices. The PBTI effect for N-channel devices is less than the NBTI effect for P-channel devices, e.g., in $SiO_2$/poly-gate technology. However in high-k metal gate technology, the PBTI effect should be taken into account. Thus, it is advantageous to consider both positive and negative bias temperature instability in assessing and forecasting device degradation.

Time dependent dielectric breakdown (TDDB), also known as oxide breakdown, occurs from localized hole and bulk electron traps in the gate oxide layer. The degradation is accelerated by applying a high amplitude electric field across the anode and cathode of the gate insulator. Damage to the oxide affects its characteristics, especially current leakage through the dielectric. As the damage accumulates, conductor traps that are located near one another form percolation conductive paths through the oxide layer. Increased current along such lower resistance conductive paths causes heating. With progressive TDDB degradation, the device continues to operate while its specifications deteriorate, unless or until a conductive path shorts through the oxide layer, making the gate inoperable.

The issue of circuit degradation is increasingly important as circuits are scaled to smaller and smaller sizes. It is appropriate when reducing the size of MOS devices also to reduce drive and bias voltages. However, in some designs, tradeoffs are made, and perhaps size is scaled down more than drive voltage, leading to added stress.

Integrated circuits employing MOS transistors are designed with the expectation of operating characteristics within specified ranges and tolerance. When the degradation of particular elements causes its operational characteristics to fall out of the range for which the circuit was designed, the integrated circuit may fail. It is advantageous to test circuit designs for MOS degradation when in the design process. It is also useful to provide an on-board technique by which the progressive degradation of MOS elements can be watched and monitored. Suitable alarms can be raised, or corrective action taken if the degradation becomes severe.

Testing products for durability often involves applying stress. In order to assess durability in a time that is shorter than a device's normal lifetime, stress is applied for testing purposes at levels that are greater than the levels of stress expected in normal use. With test MOS devices, stress tests can include applying high voltage bias, high input signal levels, elevated current density conditions and the like. The measured reliability and durability of samples tested under elevated levels of stress produce inferences about the likely reliability and durability of the production output of devices of the same or similar type, presumed to be used at nominal conditions rather than elevated stress conditions. The same sort of testing used for projecting reliability can be applied to production samples for quality assurance testing. Also, samples with different alternative materials or dimensions can be compared by comparing their operating characteristics after stress testing.

One technique for testing sample CMOS transistors, for predicting the longevity of products of similar design and/or the results of similar production steps, is to compare two test circuits embodied with similar or identical transistors in the same configuration, wherein one is particularly stressed and the other is not. An on-board device for this purpose is disclosed in Kim, T. H. et al., "Silicon Odometer: An On-Chip Reliability Monitor for Measuring Frequency Degradation of Digital Circuits," IEEE Journal of Solid State Circuits, 43:4, pp. 874-880, April 2008. This device is based on providing two ring oscillators, each oscillator comprising a plurality of cascaded inverters connected in a closed loop. Each inverters comprises a PMOS element and an NMOS element in a complementary pair. One of the ring oscillators is relatively more stressed by applying a relatively high bias voltage to the inverters of the ring oscillator. The other ring oscillator is operated as a control for purposes of comparison, relatively less-stressed at a lower or nominal bias voltage.

As stated above, one of the effects of degradation is an increase in the threshold voltage of the degraded MOS device. Degradation of the inverter transistors in the stressed ring oscillator in Kim tends to lower the operating frequency of the oscillator. This occurs because the output of a given inverter stage needs to reach a slightly higher voltage to trigger switching of a next inverter stage in cascade, after the transistors in that next inverter have been degraded to operate at a higher threshold voltage. The difference in frequencies between a stressed ring oscillator in which all the cascaded inverters are degraded, versus an identical ring oscillator in which all the inverters are fresh (or at least less degraded), represents a measure of degradation of the stressed ring oscillator. The difference in frequencies of stressed and unstressed ring oscillators is measured in Kim using a phase comparator to produce a beat frequency equal to the frequency difference.

However, one must preliminarily calibrate the two ring oscillators in Kim so both operate at the same frequency before stress is applied to the oscillator to be stressed. It would be desirable if calibration issues could somehow be avoided. Also, generally applying stress to all the cascaded inverters of the stressed ring oscillator does not permit one to distinguish between the effects of NBTI, PBTI, HCI, TDDB, etc. All these effects are lumped together. It would be desirable to have a technique that can test in a way that discriminates among the different degradation types. The stress applied to the inverters of the ring oscillator in Kim is limited to increased bias voltage on the inverters. It would be advantageous if one could test for some of these effects by varying not only the source/drain bias but also varying the gate input voltage, which is not possible except insofar as the high and low output levels of each inverter are affected by the bias voltages to which the inverter is coupled.

According to Keane, J. et al. "An All-In-One Silicon Odometer for Separately Monitoring HCI, BTI and TDDB," IEEE Journal of Solid-State Circuits, 45:4, pgs. 817-829, April 2010, four ring oscillators can be provided. Two unstressed reference ring oscillators are provided, operated in the same way as the unstressed ring oscillator in Kim, to provide two unstressed-oscillator reference frequencies to be compared against stressed frequencies from the other two oscillators. Keane uses a "back drive" technique wherein the stressed oscillators are operated as ring oscillators only in a measurement mode of operation. In a stressed mode of operation that alternates with the measurement mode, the inverters of one of the oscillators are decoupled from their cascade ring and decoupled from their Vss and Vdd drive voltages, and are separately stressed by coupling with the inverters of another of the oscillators.

Therefore, in the stress mode of operation, the cascaded inverters of the two stressed ring oscillators in Keane are decoupled from a closed loop. One set of cascaded inverters (termed the DRIVE_ROSC) is coupled to bias Vss and Vdd voltages and operated as an open loop string of inverters changing state according to a crock signal at the input. The other set of inverters (BTI_ROSC) is decoupled by switches from both Vss and Vdd bias voltages. Each input and each output of the inverters of BTI_ROSC is coupled to a respective input and output of an inverter of DRIVE_ROSC. This causes the outputs of the cascaded DRIVE_ROSC inverters to reverse bias the gate dielectrics of the BTI_ROSC inverters, and causes BTI stress. The stress switches from producing PBTI in the NMOS elements to producing NBTI in the PMOS elements, respectively, with each input clock. After a time of stress, oscillators are switched again into closed-loop ring oscillator configurations coupled in pairs to phase comparators that determine a beat frequency between the stressed and references oscillators.

At the outset, the oscillators all are adjusted for calibration to the same frequencies. One of the stressed oscillators is stressed by BTI stress alone (in particular by applying a negative gate input voltage to the PMOS transistors in the ring oscillator). The fourth oscillator is subjected to that BTI stress and is also subjected to HCI stress, by switching to a Vdd or Vcc bias of an amplitude greater than nominal. The stressed oscillator frequencies are respectively compared against their reference oscillators to provide difference frequency measures, namely by applying the two reference and two stress oscillator outputs to phase comparators to produce beat frequencies. One difference or beat frequency is related to BTI degradation. The other beat frequency is related to BTI and also HCI degradation. Comparing the two is considered to allow degradation analysis that separates the effects of BTI and HCI. However this test arrangement is not able to test for other degradation effects, notably TDDB. The beat frequency may be low when the difference in frequencies is low.

It would be advantageous to provide a circuit and technique that permits the effects of degradation effects, including HCI, NBTI, PBTI, TDDB to be assessed in isolation from one another. It would also be advantageous to assess these effects while minimizing the need for plural ring oscillators with calibration requirements and switching complication on a large integrated circuit area.

SUMMARY

It is an object of this disclosure to provide a technique and circuit configuration useful to compare corresponding CMOS elements operating under normal conditions and under several distinct conditions of elevated stress. The stress conditions are achieved by applying combinations of source/drain and gate/substrate voltages and polarities in cyclical time divisions wherein current mirrors from stressed and unstressed elements are used in turn to supply power commonly to the inverters of a same ring oscillator. The voltages are applied to elevate rates of degradation from bias temperature instability, hot carrier injection and time dependent dielectric breakdown. In certain embodiments, the differences in frequencies produced by the ring oscillator under such conditions can be resolved mathematically using digital counters that enable a quick distinction to be drawn even between small frequency differences.

The circuit and technique can be applied to preproduction design steps for choosing among alternative designs as a function of expected degradation over time. The projected longevity of integrated circuits in production can be assessed and graded for the effects of process variations. In another alternative, the circuit can be embodied as one of the on-board functional elements of a complex integrated circuit, operated periodically or during diagnostic functions, to provide a measure of advancing age and decreasing reliability during the useful life of the device and any associated circuit or apparatus.

Although multiple test circuits containing ring oscillators are possible according to this disclosure, one embodiment uses the same ring oscillator. Preliminary calibration steps are not required to equalize or normalize the functioning of two or more oscillators, because the technique compares the functioning of the same oscillator when different stress conditions are applied to the device or devices' under test. This is possible because the CMOS elements of the oscillator are not the elements that are stressed. Instead, at least one test CMOS element is stressed and compared to a comparable element that is not stressed and is used for a control. Preferably, two such CMOS elements of each polarity are used in pairs, one being operated with elevated stress conditions and the other operated at nominal or mild conditions. The stressed and unstressed elements develop current levels that power the oscillator during time divisions, and the difference in current levels leads to a difference in oscillator frequencies during such time divisions.

PMOS and NMOS elements are tested and compared. Different types of degradation such as HCI, NBTI, PBTI and TDDB are assessed using source/drain and gate voltages that elevate the rate of degradation in distinct time divisions. In one embodiment, a first test circuit can have a test PMOS element and a fresh PMOS element substantially in parallel with one another and in series with an NMOS complementary element, wherein only one of the two PMOS elements is selected during a given time division. The selected one of the PMOS elements forms a complementary pair with the NMOS element.

Similarly, one of the two selectable PMOS elements is switchably coupled to bias and input levels that differ in different test phases or time divisions. Such bias and/or input levels can be power supply Vss/Vdd levels or higher/lower levels can be applied, providing switchably selected differences in operational stress.

The switching arrangements select, by time divisions, a PMOS or NMOS polarity element, and further select one of the stressed and unstressed elements of such polarity, arranged in a complementary CMOS pair. The switching arrangements select by time divisions different levels or polarity of source/drain bias (or no bias) and different levels and polarities of gate input voltage to apply to the selected stressed test element or to the unstressed element serving as the control. The stressed or unstressed element in such conditions of bias and input voltage is used as a current source. The level of current supplied varies with the extent of degradation of the element. The current source is coupled commonly to the power supply voltage bias inputs of all the cascaded inverters of a ring oscillator.

Each inverter in the ring oscillator has an input threshold voltage at which the logic level of the inverter is switched. A characteristic parallel capacitance resides at the output of the inverter, which is coupled to the input of the next inverter in the ring oscillator. Varying the current supply to the inverter varies the rate at which the capacitance is charged to the threshold voltage that switches the next inverter in the ring oscillator cascade. The variation in current thereby controls the frequency of the ring oscillator. The difference between the stressed and unstressed frequencies output from the ring oscillator can be determined by counting ring oscillator cycles during a timed interval provided using a digital counter coupled to a reference clock oscillator associated with the switching network that applies bias and gate input voltages to the stressed and unstressed PMOS and/or NMOS elements in a time division multiplexed repetitive cycle. This frequency counts derived from each time division allow a distinction to be drawn and an assessment reached as to the effects of each of HCI, NBTI, PBTI and TDDB degradation on the devices under test. The devices under test are produced with one or more characteristics in common with other elements on the integrated circuit (e.g., having similar dimensions, being made using the same epitaxial processes, etc.) and therefore the effects of degradation of the devices under test can be inferred to reflect the degradation occurring in the integrated circuit as a whole.

In one arrangement, a single ring oscillator can be employed and the inputs are switched to select between CMOS elements of opposite polarities in different time divisions, as well as selecting stress conditions of different types and levels. In a different arrangement, at least two ring oscillators are employed simultaneously for respectively testing an NMOS element and a PMOS element at the same time (while switching in time divisions between the stressed device under test and the unstressed control device, and also applying different levels of stress). In each case, the device under test controls the current level provided in the bias voltage supply to a respective ring oscillator.

An NMOS device under test can provide a current source to control the positive (Vdd) current supply to the ring oscillator inverters through P-MOSFETs coupled between the positive supply and the Vdd terminal of inverters embodied as complementary NMOS/PMOS pairs. Likewise, a PMOS device under test can provide a current source to control the negative (ground) current sink from the ring oscillator inverters to ground through N-MOSFETs coupled between the negative supply and the low voltage terminal of respective inverters. As shown by examples hereinafter, this can be done using one ring oscillator in time divisions, or two ring oscillators for concurrent testing of different polarities in time divisions. For different polarities, the two test circuits and ring oscillators are substantially a complementary versions of one another.

The test circuits are switched through a set of logic states causing the bias voltages and the input levels at the, gates of the corresponding stressed and unstressed MOS elements to vary at different phases of operation. Certain level and bias conditions applied to the Device Under Test (DUT) induce source-drain conduction (for example inducing HCI) in at least one phase. A reversed polarity gate input level is provided at least at one other phase to induce NBTI (or PBTI). The ring oscillators coupled in association with the exemplary stressed and unstressed ("fresh") PMOS or NMOS devices generate frequencies that vary as a function of the applied stress conditions (bias and gate input voltages). The applied stress conditions are varied during respective phases of the test operation as each distinct stress condition is brought to bear and operations are compared to unstressed nominal conditions and/or to other stress conditions. However, this is not because the ring oscillators are stressed. The difference in frequencies is due to controlling the bias voltages applied to the inverters of the ring oscillator within nominal limits.

In one mode, the gate leakage current for the MOS device under test is induced in the unstressed or fresh MOS device, thereby eliminating the effect of gate leakages for assessing HCI under stress. In another mode, the same input gate voltage is applied to the element under test and to the unstressed fresh device. In still other modes, the device under test is coupled to stress levels for the bias voltage and for the gate voltage input. In one or more predetermined sequences, the respective test and control modes are established and the device under test as well as the unstressed fresh MOS device are coupled to a ring oscillator during successive intervals timed according to a control. The frequencies can be determined by counting transitions of an inverter in the ring oscillator over timed periods, permitting the effects of each form of stress to be compared between stressed and unstressed conditions. Inasmuch as the same ring oscillator can be used in time divisions by this technique, it is not necessary to calibrate two ring oscillators before testing.

Accordingly, switching arrangements as disclosed couple gate and drain/source voltage levels to representative MOS devices, to establish stress conditions or nominal operational levels, for comparing devices that are degrading versus fresh MOS devices. The stress conditions involve different switched combinations of gate drive voltage and drain/source bias, applied to PMOS or NMOS elements under test or serving as control devices for comparison, during different phases of a cyclic test. The MOS elements function as sources of current, each coupled in turn to power a ring oscillator, causing the frequency of oscillation to vary.

Digital counters can be used to accumulate cycles from the ring oscillator over the periods of stress versus nominal operation, providing a precise assessment of frequency difference indicating degradation. The disclosed techniques permit the effects of different types of device degradation to be distinguished. No calibration issues arise because the same ring oscillator is used in nominal and stress conditions, but by time divisions.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of this subject matter.

FIG. 1 is a schematic illustration of two NMOS and two PMOS devices with different source/drain bias and different gate voltage conditions, useful for distinguishing among types of MOS degradation occurring with such different conditions.

FIG. 2, labeled "prior art," shows the prior art technique of applying excess bias voltage to a stressed one of two pre-calibrated ring oscillators and beating the resulting frequency against the output of the other ring oscillator, which is not stressed or is stressed only by nominal bias conditions.

FIG. 3, labeled "prior art," demonstrates a back drive technique with four cascaded inverter networks.

Figure 5:
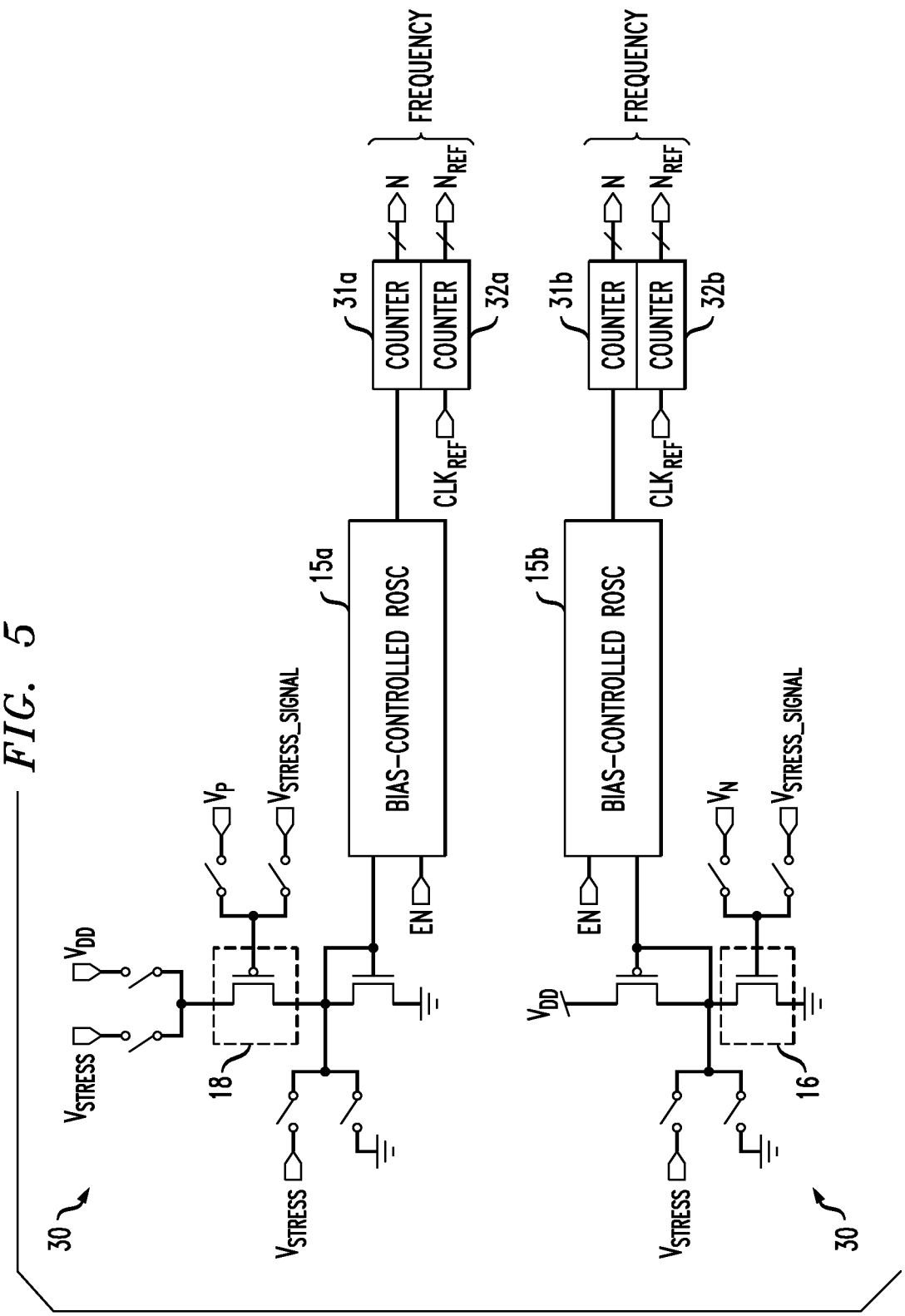
FIG. 5 is a schematic demonstrating switchable coupling of alternative bias voltages, stress bias voltages, signal levels and stress signal levels to a ring oscillator according to FIG. 5 in different modes, and resolving frequency differences between the respective modes using digital counters.
Figure 6B:
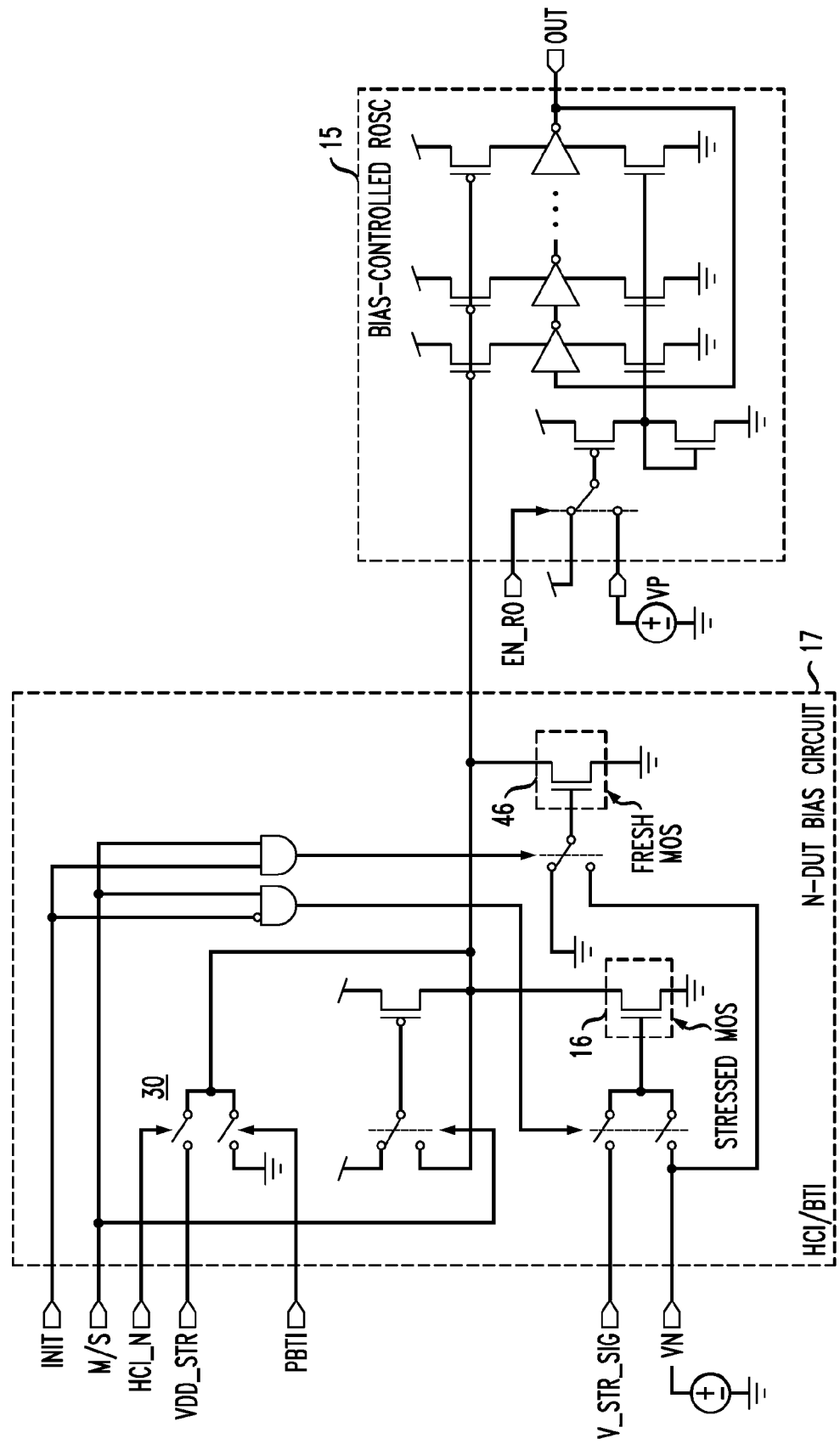

FIGS. 6A and 6B, which are collectively referenced as FIG. 6 herein, show a schematic illustration of a practical embodiment of FIG. 5.

Figure 7:
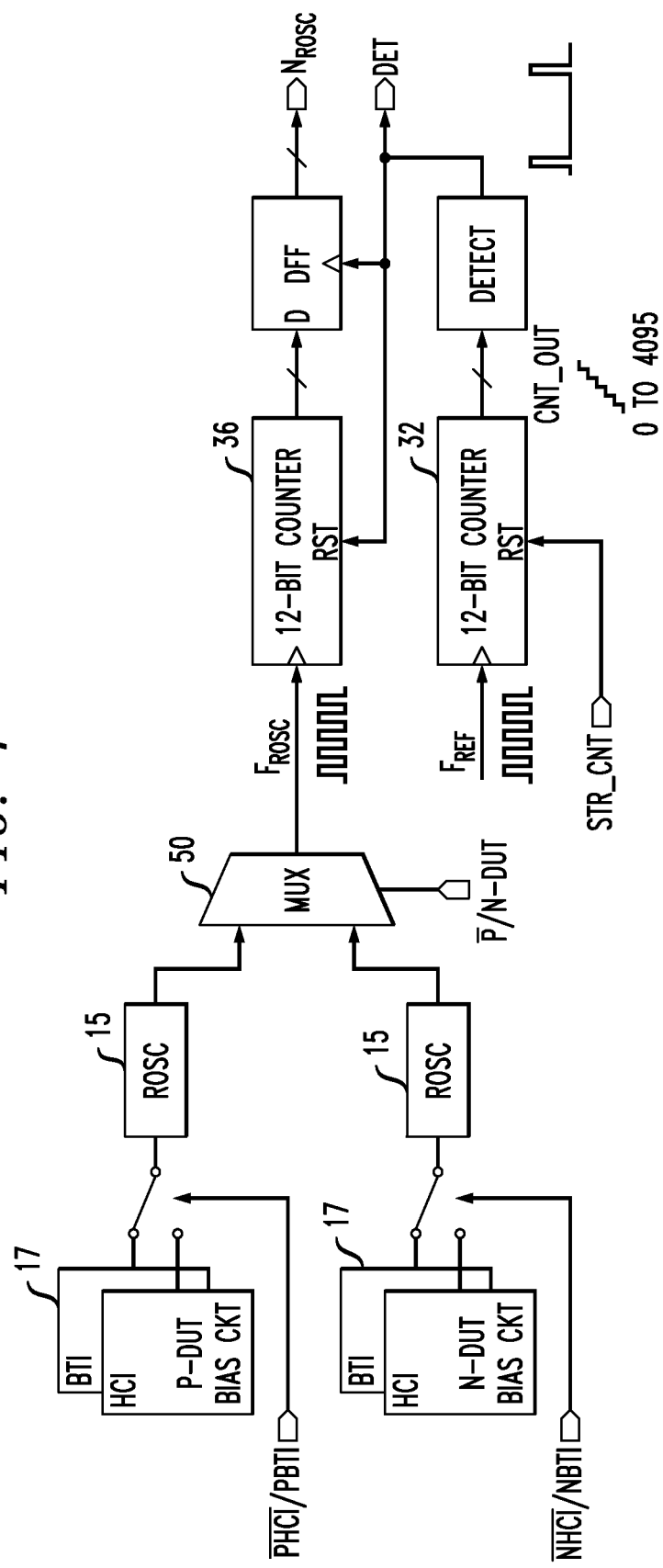

FIG. 7 is a partly schematic block diagram of an embodiment illustrating resolution of frequency differences using digital counters.

Figure 8:
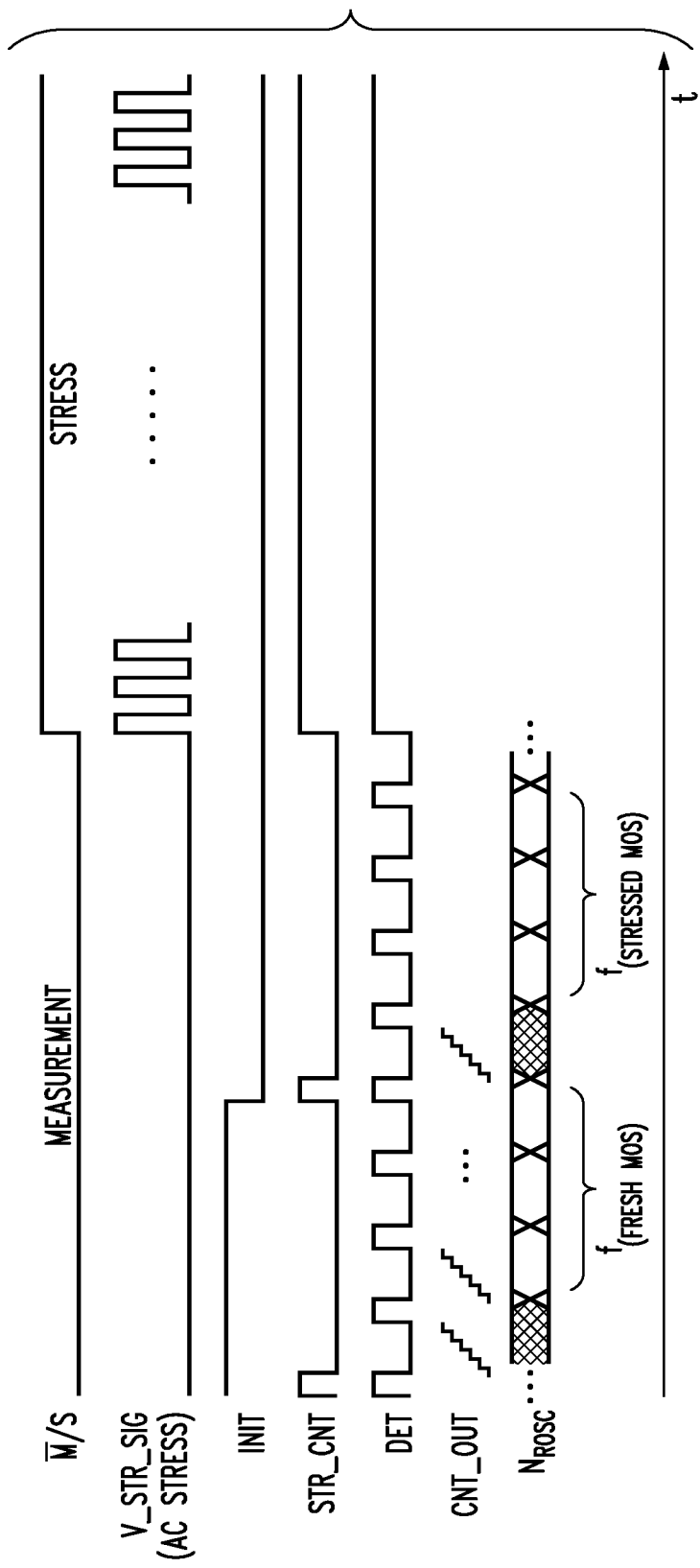

FIG. 8 is a timing diagram showing signal timing according to one example.

Figure 9:
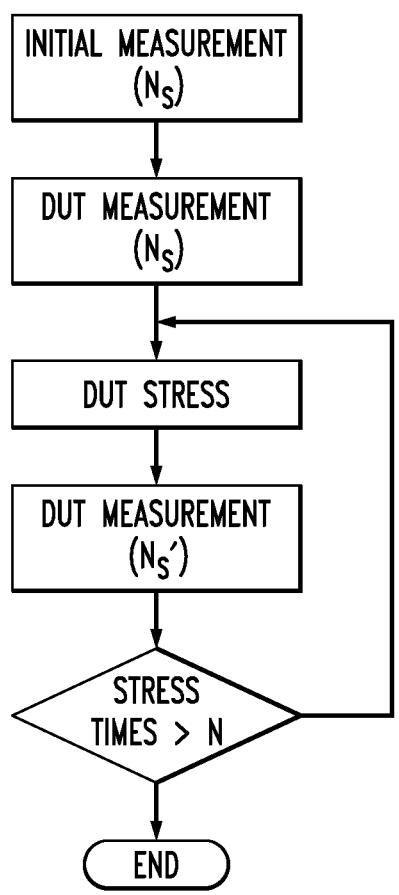

FIG. 9 is a flowchart illustrating iterative measurement steps.

DETAILED DESCRIPTION

Figure 1:
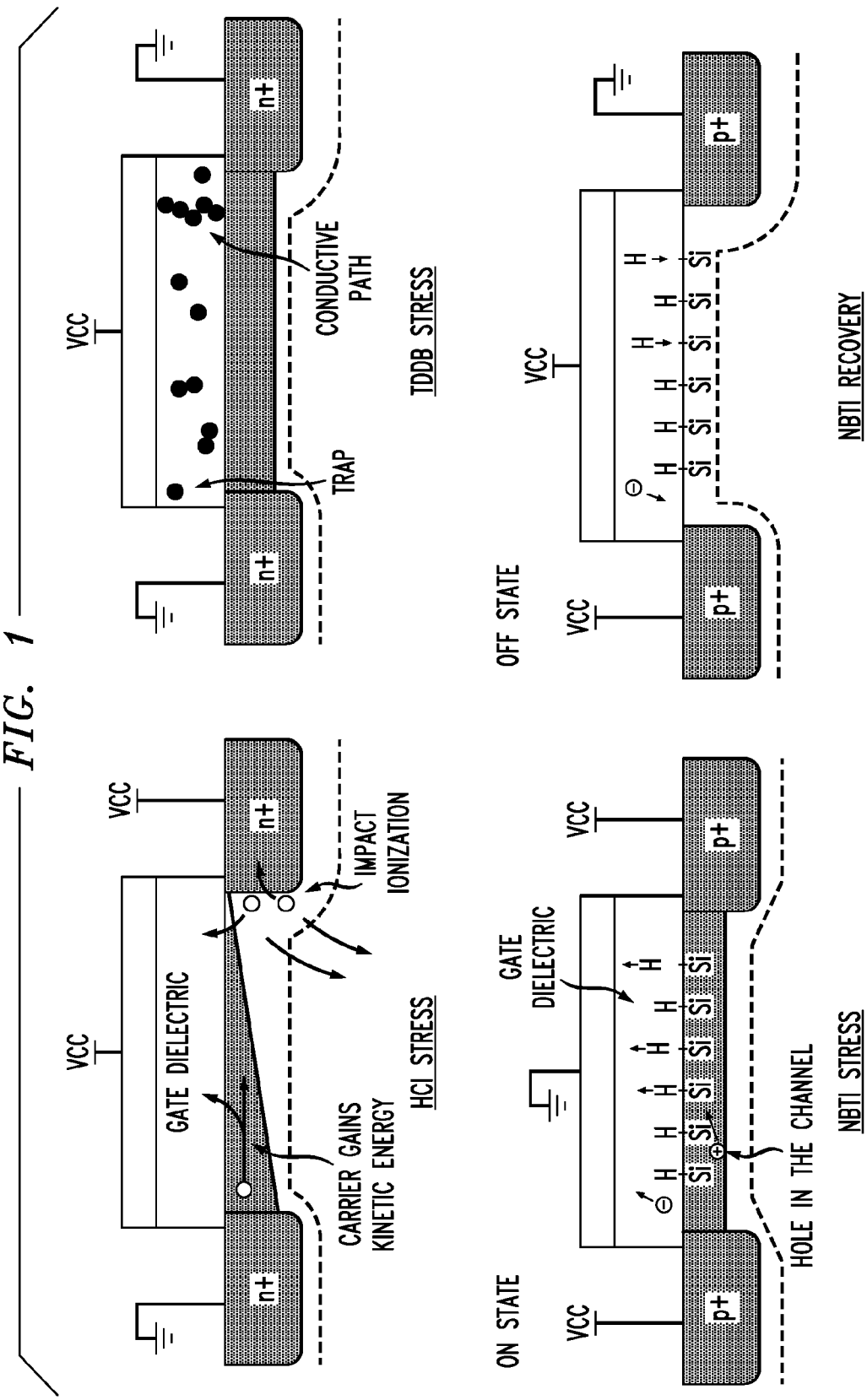

FIG. 1 is a figurative comparison of cross sections through CMOS elements and compares how the presence or absence of source/drain bias voltages and gate/substrate input voltages contribute to certain types of degradation in NMOS and PMOS devices.

A source/drain voltage in an NMOS device can impart kinetic energy to electrons as charge carriers, leading to injection into the gate dielectric of carriers of higher energy or carriers that result from ionization. This is known as hot carrier injection (HCI) and causes deterioration of operating characteristics including elevation of device threshold voltage.

Apart from source/drain voltage, a positive potential difference between the gate and substrate can cause the migration of charge carriers into the gate dielectric, producing charge traps that accumulate over time and can cause paths of relatively lower resistance through the dielectric, leading to localized heating. This effect is time dependent dielectric breakdown (TDDB), and also causes deterioration of operating characteristics. In an extreme case, the charge traps in proximity can lead to a conductive path and failure of the gate dielectric.

A negative potential difference between the gate and substrate of a PMOS device affects charge carriers in the channel and in the dielectric, separating chemical bonds and increasing the amplitude of the device switching threshold. Such an effect, called negative bias temperature instability (NBTI), is reversible when the gate bias is off and source/drain bias is applied. One can also identify positive bias temperature instability (PBTI) in N-channel devices. A positive bias temperature instability (PBTI) effect occurs for N-channel devices, and is less than the NBTI effect for P-channel devices, e.g., in $SiO_2$/poly-gate technology. However in high-k metal gate technology, the PBTI effect should be taken into account.

It is generally the case that these types of degradation increase gate leakage and elevate the device threshold voltage. The degradation is greater with higher applied source/drain bias (higher current density), greater with higher gate/substrate potential difference, and greater over time with device aging. Among devices with different configurations, such as different channel length or gate thickness, one or another of the types of degradation may be more or less prominent. The different types of degradation are caused by or aggravated by bias and input voltage conditions, but it may be not readily be possible to distinguish between the types of degradation and their interaction with dimensions, voltages and operating conditions over time.

Figure 2:
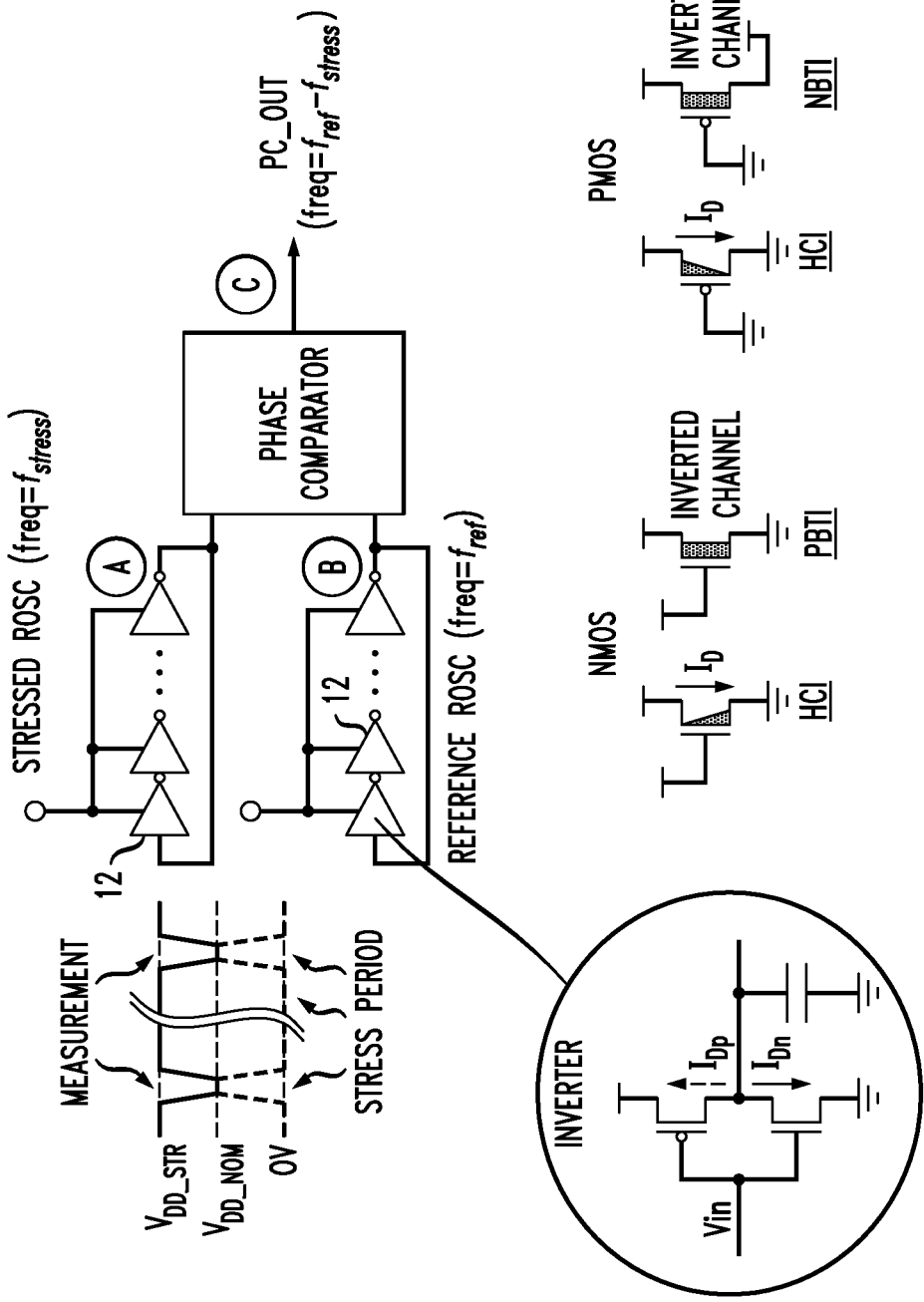

FIG. 2 shows a conventional test circuit that has limited ability to distinguish among degradation causes and effects. Such a circuit is disclosed in Kim, T. H. et al., "Silicon Odometer: An On-Chip Reliability Monitor for Measuring Frequency Degradation of Digital Circuits," IEEE Journal of Solid State Circuits, 43:4, pp. 874-880, April 2008. Two ring oscillators A and B are provided. One of the ring oscillators A is stressed by application of an elevated bias voltage $V_{DD-STR}$ during a stress period. The other ring oscillator B is operated at nominal bias voltage $V_{DD-NOM}$. Between stress periods, the nominal bias is applied to both ring oscillators and their outputs are beaten together at a phase comparator C, providing a frequency output that has a component at the difference between the frequencies of the two oscillators.

The ring oscillators each comprise a cascaded succession of inverters coupled in an endless loop (i.e., with the output of the last one coupled to the input of the first one). A detail 12 shows that each inverter has a complementary PMOS and NMOS element, of which one is conductive and the other conductive in each logic state, and vice versa. The gates of the PMOS and NMOS elements are coupled at the inverter input and the inverter output is the junction between the elements.

At the junction, the inverter is subject to a characteristic parallel output capacitance, and the supply voltages at $V_{DD}$ and ground have characteristic series resistance. When the input Vin is switched to a low voltage logic level, the inverter output goes high. Specifically, the PMOS element conducts due to low voltage on its gate and couples the output to the $V_{DD}$ supply voltage while the NMOS element is nonconductive. The capacitance charges up to the supply voltage through the series resistance of the supply. When the inverter output goes low (because the voltage on the input is high), the PMOS element becomes nonconductive and the NMOS element discharges the capacitance to ground through the series resistance of the ground conductor.

As discussed above, an effect of degradation is to elevate the threshold voltage of a CMOS device. When the two ring oscillators are operated in the measurement mode (after preliminary calibration and at equal bias voltages for purposes of measurement), the degradation of the CMOS elements in the stressed ring oscillator reveals itself as a reduction in the operational frequency of the ring oscillator whose CMOS inverter elements have been stressed, compared to the operational frequency of the ring oscillator whose inverter elements have not been stressed. The threshold voltage of the CMOS elements that suffered degradation is higher such that each cascaded inverter in the degraded oscillator takes a longer time to charge its output capacitance up to the switching threshold voltage of the next inverter in cascade.

Figure 3:
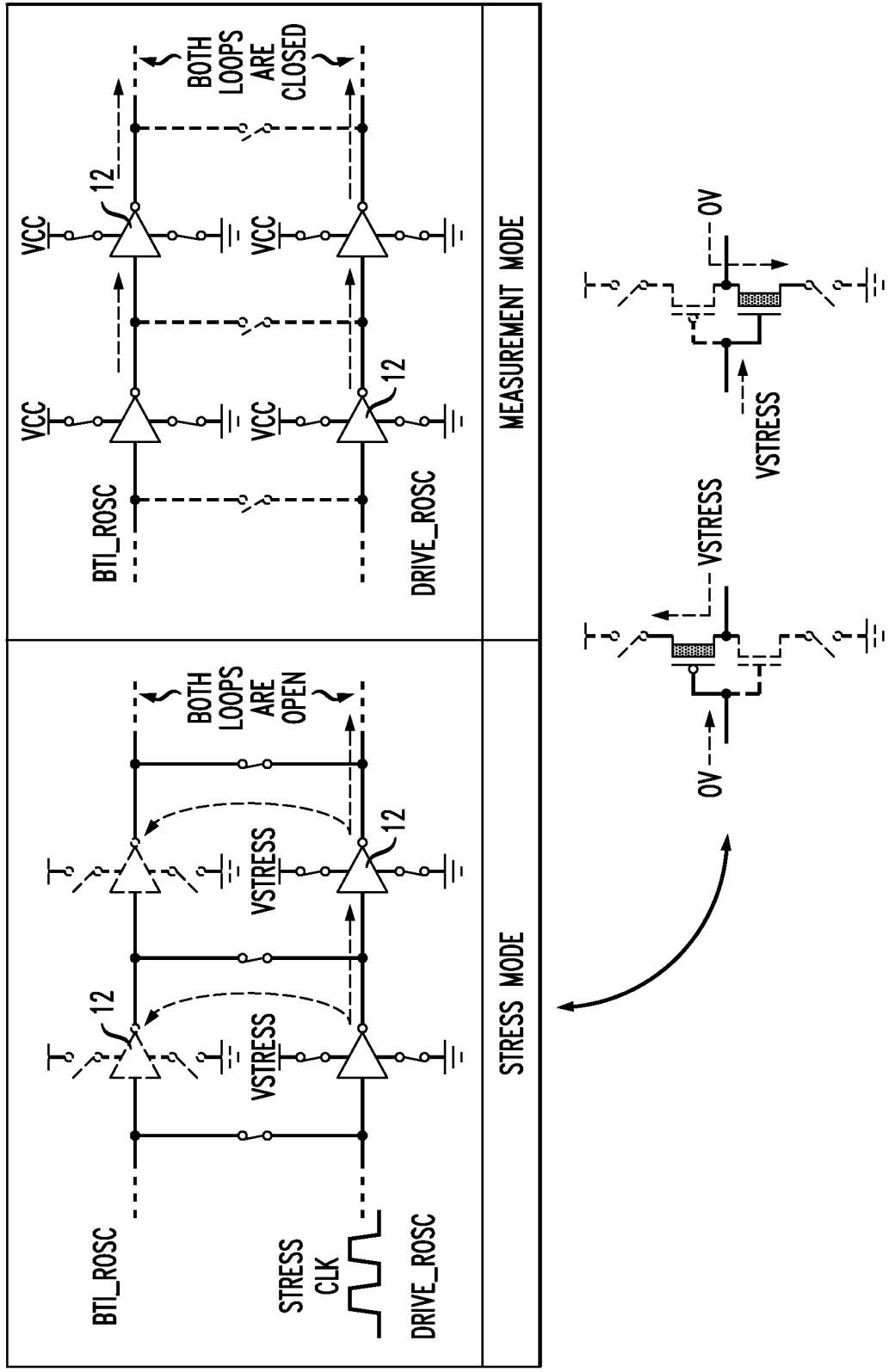

FIG. 3 demonstrates another conventional arrangement using serial inverters of which one set of inverters is stressed and the other set of inverters is unstressed. In this arrangement, the inverters are coupled to operate as ring oscillators only when in a measurement mode of operation. In that measurement mode, operation is much the same as discussed with respect to FIG. 2, i.e., the output of a stressed ring oscillator BTI_ROSC operating at reduced frequency due to degradation is beaten at a phase comparator (not shown in FIG. 3) against the output of an unstressed ring oscillator DRIVE_ROSC to develop a beat frequency representing the frequency difference. In FIG. 3, the technique for stressing the inverters is switchably to decouple the stressed inverters from their voltage bias $V_{DD}$ and ground, and instead to couple each stressed inverter to one of the unstressed inverters, namely input-to-input and output-to-output. This applies stress in the form of a gate-to-substrate voltage of a polarity that is determined by the logic state of the unstressed inverter. A clock signal Stress_CLK is applied to toggle the logic state of the unstressed inverters, which are coupled in cascade but are not in a closed loop. Changing the logic states applies BTI stress alternately to the PMOS and NMOS element of the associated stressed inverter as shown in the FIG. 3 schematic. After a period of stress, the switches are changed back into a measurement mode. The stressed inverters are decoupled from the unstressed inverters and $V_{DD}$ and ground bias is applied. The stressed an unstressed inverters are coupled into respective closed loops as ring oscillators. A phase comparator develops a difference frequency that is affected by BTI degradation.

Figure 4:
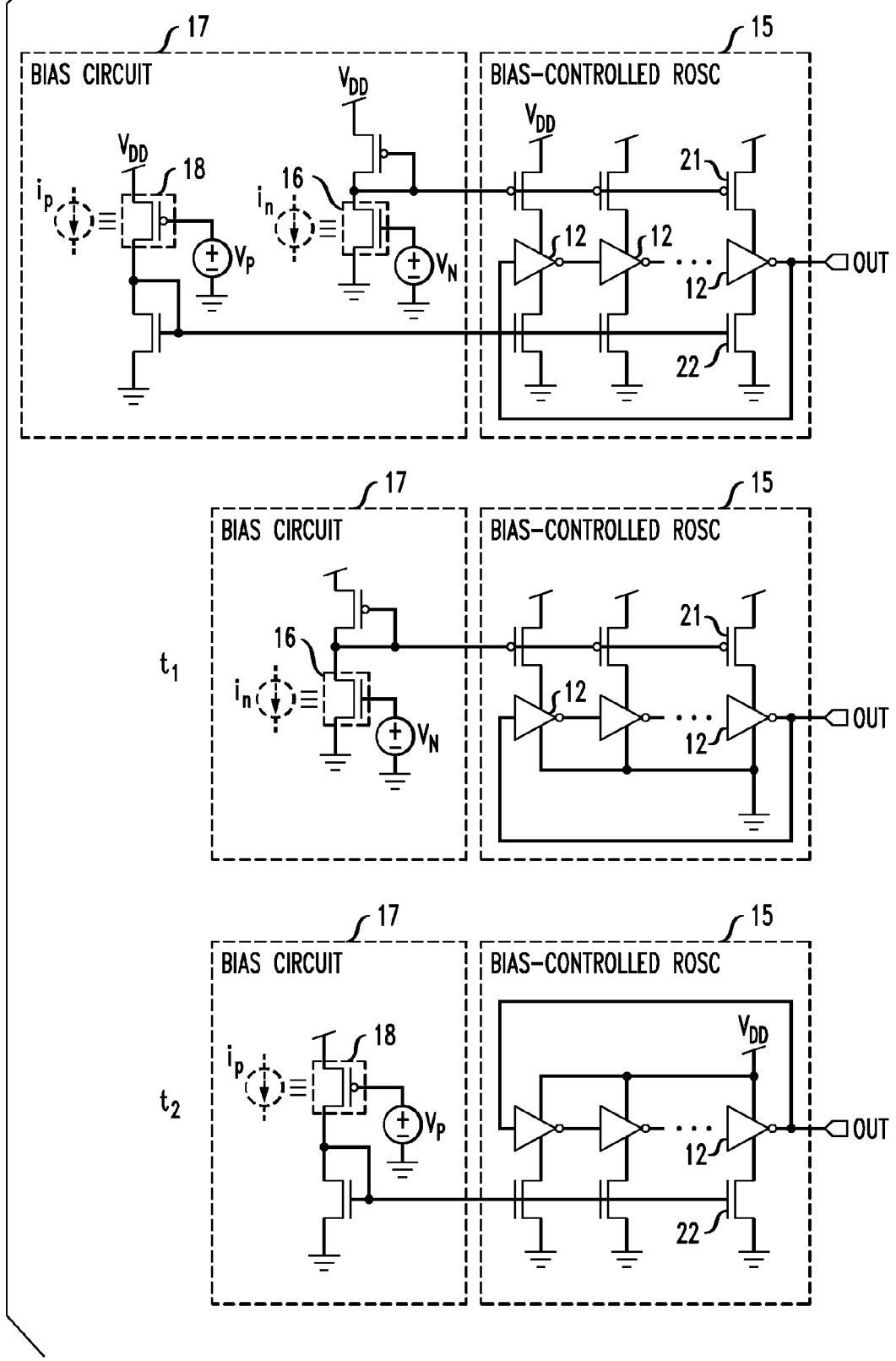
FIG. 4 is a generalized schematic demonstrating a first embodiment according to the present disclosure, wherein respective PMOS and NMOS devices under test are used as current sources to control the drive bias voltages to a ring oscillator, which can be operated in time divisions for testing the PMOS and NMOS devices in turn, or using two ring oscillators.

FIG. 4 is a simplified schematic demonstrating an arrangement according to the objects of the present disclosure, wherein a ring oscillator is provided to develop a stress-indicating frequency and an unstressed frequency. The inverters 12 of the ring oscillator are used to develop a frequency that varies as a function of stress applied to one or more devices under test, namely NMOS element 16 and a PMOS element 18 in FIG. 4. The inverters 12 of the ring oscillator are made responsive to the stress on elements 16, 18 but the inverters are not themselves stressed. Instead, the devices under test, namely NMOS element 16 and PMOS element 18, are configured as current sources that control the current supplied to each of the inverters from $V_{DD}$ and ground connections.

Each inverter in the ring oscillator comprises a PMOS transistor and an NMOS transistor in a complementary pair. The inverter has a threshold switching voltage at its input, passed upon changing logic state, and a characteristic parallel capacitance at the node where the output of the inverter is coupled to the next inverter in the ring oscillator (see the schematic of an inverter in FIG. 2). When changing state, the characteristic capacitance is charged or discharged. The voltage at the node passes the threshold voltage at a time related to the current supply to the inverter. By supplying a current from a source that is varied as a function of the extent of degradation of one or more devices under test 16, 18, the operational frequency of the ring oscillator 15 is varied as a function of such degradation.

In the ring oscillator 15, current is supplied to each of the inverters 12 from $V_{DD}$ through an associated PMOS current control element 21. Current from each inverter 12 sinks to ground through an associated NMOS current control element 22. The current control elements 21, 22 are controlled in turn by the devices 16, 18 that are under test. The PMOS current control elements 21 are controlled by NMOS element 16 as a device under test. The NMOS current control elements 22 are controlled by PMOS element 18 as a device under test.

Degradation of the device under test cause operational variation, for example, in gate leakage current. Degradation at the NMOS device under test (element 16) elevates the voltage at the gates of PMOS current control elements 21 and tend to throttle current supply to the inverters 12. Likewise, degradation at the NMOS device under test (element 18) lowers the voltage at the gates of NMOS current control elements 22, throttling the sinking of current to ground.

With relatively higher or lower current levels supplied to and from the inverters between $V_{DD}$ and ground, the time duration is shorter or longer, respectively, for the output of the inverters 12 to cross the threshold input voltage at which the next inverter in cascade changes state. In this way, the variation in the degradation of the devices under test 16, 18 is converted into variation of the operational frequency of the ring oscillator 15.

The controlling signal from the device is affected by the input at the gate of the device under test, i.e., $V_N$ and $V_P$ in FIG. 4, which provide for a current $I_N$ and $I_P$ in the complementary pair of PMOS/NMOS elements of which the device under test 16 or 18 is a member. In order to distinguish between the effects of degradation at stressed or non-stressed voltages applied to devices under test 16 or 18, the input voltages $V_N$ and $V_P$ can be applied in separate time divisions $t_1$ and $t_2$ as shown in FIG. 4. Alternatively, two ring oscillators 15 can be provided, each being controlled by a device under test 16, 18 of one polarity as shown.

Whether using one or two ring oscillators 15, it is desirable to apply multiple types of stress involving different combinations of source/drain and gate bias polarities, and potentially different levels of stress voltage and stress current conditions. As shown in FIG. 5 in an embodiment with two ring oscillators, this is accomplished using switching networks 30 to apply selected combinations of nominal bias voltages $V_{DD}$ and ground and/or stress-inducing bias $V_{stress}$ and signal levels $V_{stress\_signal}$. The particular levels selected are chosen to apply stress to the device under test. The output level from the device under test, in different time divisions wherein switching networks 30 couple selected drain/source or gate bias voltages, cause the respective ring oscillator 15a or 15b to produce a frequency that varies with the stress and aging of the device under test due to control of the bias on the ring oscillator as discussed with respect to FIG. 4. When activated by an enable signal EN that starts the ring oscillator and clears all counters, in coordination with the switching network 30, cycles of the variable frequency signal from each ring oscillator 15a or 15b are counted by an associated digital counter 31a or 31b. The count proceeds for a time period determined by a second associated counter 32a, which counts cycles of a reference clock signal $CLK_{REF}$ at a known non-varying reference frequency for a predetermined number of cycles $N_{REF}$. The difference in the number of counts from the clock and the ring oscillator when counting over the same time period or equal time periods is mathematically related to the difference in frequency.

It should be recognized in this disclosure that where passages state that certain voltages or currents are applied or coupled to other elements, or that elements are coupled together, such descriptions include but are not limited to situations in which the elements are connected directly, without intervening or additional circuit elements. Thus, where signals or voltages or currents or devices are described as coupled or applied or connected or similarly related in the description, the disclosure should be deemed to include the possibility of connection through or including additional elements and intervening devices unless the context precludes such a conclusion.

According to the foregoing arrangements, it is possible to stress a device under test and to monitor the results in manner that can be related to device reliability. The provisions shown permit different levels of stress to be applied and compared. It is advantageous, however, not only to compare different types of stress but also to compare the device under test, which is progressively degraded by stress, versus a corresponding device that has not been subjected to stress. Such an arrangement is shown in FIG. 6, which also shows a practical embodiment of associated switching networks 30 in the current source blocks 17. In this embodiment, the two polarity devices 16 and 18 are tested concurrently using two ring oscillators, rather than using time divisions of one ring oscillator as discussed with respect to FIG. 4.

Testing is accomplished in time divisions. Thus, one or more forms of stress are applied to the device under test (NMOS device 16 and PMOS device 18) while repetitively sampling the frequencies of the ring oscillators. This proceeds for a predetermined time period, whereupon the stress can be removed and operations returned to nominal source/drain and gate bias. The ring oscillator frequencies are likewise sampled repetitively. Depending on the applied stress, hot carrier injection HCI and bias temperature instability BTI may contribute to leakage and an incremental contribution is made to time dependent dielectric breakdown TDDB. Some of the effects are at least partly temporary (such as BTI) and dissipate after stress is relieved. Some of the effects are permanent (such as TDDB). The contribution of each effect can be discerned by comparing the response of the device under test to different forms of stress and recovery. Additionally as shown in FIG. 6, the switching networks 30 are arranged in certain time periods to wholly decouple the device under test 16 or 18, and to substitute a fresh device of the same type, i.e., an NMOS device 46 that has not been stressed for NMOS device 16, and a PMOS device 48 that has not been stressed for PMOS device 18. This technique enables comparison of the operational characteristics of a never-stressed device (or perhaps only mildly stressed by use as a comparison device) versus a test device 16 or 18 that has been subjected to effects that include permanent degradation effects such as formation of charge traps and percolation conductive paths through the gate dielectric due to TDDB due to elevated stress.

FIG. 6 illustrates alternative switched inputs that provide alternative stressed or unstressed bias VDD_STR and VDD, stressed or unstressed gate input voltages V_STR_SIG or VP, selection of the stressed or fresh MOS devices 16/46 or 18/48. Additionally, gates are provided for switching between stress application and measurement intervals. FIG. 7 schematically shows how the PMOS and NMOS polarity stages of current source/bias controls 17 and ring oscillators 15 alternate with one another. In a given interval, one can use the counters for measurement while the other applies stress and in the next interval the functions switch. FIG. 8 provides a timing diagram for a device under test of a given polarity, showing measurement/stress intervals, time divisions for application of an alternating current signal stress V_STR_SIG as well as bias control, repetitive measurement intervals, and intervals for measurements against the fresh MOS device and the comparable aging device. This timing diagram is substantially the same, but at opposite phase times, for the device under test of the other polarity.

FIG. 9 is a flowchart showing one sequence of tests, in this case for the NMOS polarity device. In the initial measurement, ring oscillator cycle counts are acquired. The device under test is then alternatively stressed and its frequency effects measured for a predetermined number of iterations.

Because the same ring oscillators are used for producing the counts in different situations, such as stressed versus unstressed frequency situations, variations that might be induced by process variations among different ring oscillators, voltage differences or temperature differences, for example at different locations in an integrated circuit (generally "PVT" variations) do not arise. It is not necessary to pre-calibrate two ring oscillators. Because the frequency different information is provided by counting cycles on a clock oscillator versus a ring oscillator in different bias conditions, the measurement is sensitive to fine differences in frequency. Assuming that $N_0$ and $N_1$ are the counts obtained from the ring oscillator at frequency $f_0$ and $f_1$ and $N_R$ is the fixed count obtained by counting the reference clock at frequency $f_R$ for the same time, then:

$$f_0 = \frac{N_0}{N_R} f_R \text{ and } f_1 = \frac{N_1}{N_R} f_R$$

$$\Delta f = f_1 - f_0 = \frac{N_1 - N_0}{N_R} f_R$$

$$N_1 - N_0 = \frac{N_R}{f_R}[(f_1 + \Delta_{PVT}) - (f_0 + \Delta_{PVT})]$$

The contribution attributable to process/voltage/temperature variation $\Delta_{PVT}$ thus drops out of the equation because the value is the same in the same test configuration and ring oscillator. The frequency difference is accurately discerned from the difference in counted cycles. The device is compact due to use of a current source or current mirror arrangement to control the bias on the ring oscillator as a function of operation of the device under test. Only one ring oscillator is necessary. Two are preferred, namely one for each polarity device as described above, but it is not necessary to provide two ring oscillators for direct to comparison. Thus the device is compact and calibration is not an issue. Switching methods and separation of stress application and measurement in time divisions enable separate stress scenarios and measurement opportunities, making it possible to obtain frequency differences for comparing AC or DC stress, stress and recovery, permanent degradation by comparison with a fresh device, and separately discerning the effects of HCI, NBTI, PBTI and TDDB.

Accordingly, the reliability of an overall integrated circuit is inferred from the operational characteristics of sample metal oxide semiconductor (MOS) devices 16, 18, 46, 48, switchably coupled to drain/source bias (e.g., $V_{DD}$, ground, VDD_STR) and gate input voltages (e.g., VP, VN, V_STR_SIG) that are nominal, versus voltage and current conditions that enhance stress and cause temporary or permanent degradation, e.g., hot carrier injection (HCI), bias temperature instability (BTI, NBTI, PBTI), time dependent dielectric breakdown (TDDB). The MOS devices under test (or preferably PMOS and NMOS devices) 16, 18 and 46, 48 are arranged in current source circuits 17 to control the voltage bias applied a ring oscillator 15. A frequency comparator 32, 36 counts the frequency of the oscillator during the nominal conditions and during the enhanced stress conditions. The oscillator can be a ring oscillator with inverter stages and is operated at variable frequency based on stress on the sample device but is not stressed.

The device under test comprises at least a metal oxide semiconductor (MOS) device of a first polarity. Preferably devices of both NMOS and PMOS polarity are used as test devices, either as different current sources 17 coupled in turn to control the oscillator 15 (FIG. 4) with separate ring oscillators (FIG. 5 or 6). A switching network 30 couples the MOS device with selected combinations drain/source bias and gate input voltage. The combinations are selected to apply to the test device and to a control device, nominal voltage and current conditions and also enhanced stress conditions in different time divisions. The stress conditions temporarily or permanently alter the operating characteristics of the MOS device, especially by producing forms of gate leakage that are associated with hot carrier injection (HCI), bias temperature instability (BTI, NBTI, PBTI), and/or time dependent dielectric breakdown (TDDB). Testing and comparing operation during and after various stress conditions, and also comparing nominal unstressed operation of the aging test device and nominal operation of a comparable fresh MOS device (that has not been stressed significantly) produces information by which circuit longevity is assessed.

According to one aspect, the MOS device 16, 18 under test is a member of a complementary pair that also comprises an MOS device of a second polarity. Specifically, MOS devices of first and second polarities are coupleable at a junction as a complementary pair, one being the device under test. The complementary pair is coupled across a potential difference, with a current source provided at the junction. The current IN or IP from the current source (FIG. 4) controls an oscillator 15 comprising a plurality of stages in a cascaded loop. The oscillator 15 produces a signal that varies in frequency at least partly as a function of a bias level applied to the oscillator from a voltage supply (VDD to ground).

A bias control circuit is coupled to supply the oscillator stages 12 with power from the voltage supply. The bias control circuit has a control input coupled to the junction of the complementary pair. As a result, the oscillator is driven to provide a frequency N at its output that differs between the nominal voltage and current conditions versus the enhanced stress conditions applied to the MOS device 16 or 18.

A frequency comparator 31, 32 (FIG. 5) determines for comparison the frequency of the oscillator during different situations of nominal voltage and current conditions versus enhanced stress conditions of the MOS device and/or using the test MOS device versus using a fresh device provided for comparison. The different situations are caused to occur in time divisions (FIG. 8) and can be multiplexed (FIG. 7) so that the different polarity portions alternate between using a shared counter during a measurement phase or not using the counter during a device stress phase.

The exemplary apparatus uses a ring oscillator 15 and the stages comprise complementary CMOS pairs functioning as inverters 12, the inverters having a threshold input voltage and a characteristic output parallel capacitance. The bias control circuit coupled to supply the oscillator 15 comprises one or more CMOS transistors having a base coupled to the junction with the test device 16, 18 or 46, 48 and a drain and source coupled between the CMOS pairs of the inverters and one of two terminals that provide a potential difference for powering the inverters 12 of the oscillator 15.

The subject matter of this disclosure involves a method as well as an apparatus. The method comprises coupling a metal oxide semiconductor (MOS) device 16 or 18 having a first polarity into a switching network 30 operable to couple to the MOS device selected combinations drain/source bias and gate input voltage, and applying to the MOS device selected combinations of drain/source and gate voltages that model nominal levels of operation and enhanced stress conditions at different times. A control signal is derived from said MOS device 16 or 18, such as a current control signal that varies with a level of temporary or permanent degradation of operating characteristics of the MOS device 16, 18. The current control signal operates a controllable oscillator 15 to develop a frequency as a function of the control signal. In this way, the MOS device 16, 18 is tested under nominal levels of operation and under enhanced stress conditions. The testing can be accomplished repetitively in distinct time divisions, and with portions of the testing operation multiplexed through the same elements, such as the same oscillator using different MOS polarities for the device under test and for the bias control devices (FIG. 4). Likewise the device can be multiplexed to share a digital counter 31 arranged to count oscillator cycles during a predetermined time interval, e.g., measured by counting a reference clock signal to a given reference number count. Differences in count correspond to differences in frequencies. Differences in the frequency of the oscillator during said time divisions are regarded as a measure of degradation of the operating characteristics of the MOS device. By inference, the reliability of all similar MOS devices is assessed for the integrated circuit of which the test circuit is a part.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. An apparatus for assessing operating characteristics of metal oxide semiconductor devices, comprising:
  a metal oxide semiconductor (MOS) device of a first polarity;
  a switching network operable to couple to the MOS device selected combinations drain/source bias and gate input voltage, wherein the selected combinations include application of nominal voltage and current conditions and include application of enhanced stress conditions, said enhanced stress conditions temporarily or permanently altering the operating characteristics of the MOS device;
  a current source circuit comprising said MOS device of said first polarity and further comprising a complementary MOS device of a second polarity, wherein the MOS devices of said first and second polarities are coupleable at a junction as a complementary pair, in series with one another and across a potential difference, to provide a current source to a load coupled to the junction;

an oscillator comprising a plurality of stages in a cascaded loop, wherein the oscillator produces a signal that varies in frequency at least partly as a function of a bias level applied to the oscillator from a voltage supply; and, a bias control circuit coupled to supply the oscillator with power from the voltage supply, wherein the bias control circuit has a control input coupled to the junction of the complementary pair, such that the oscillator frequency differs between the nominal voltage and current conditions versus the enhanced stress conditions of the MOS device.

2. The apparatus of claim 1, further comprising a circuit responsive to the oscillator operable to produce a measure representing the operating characteristics of the MOS device in the enhanced stress conditions.

3. The apparatus of claim 1, further comprising a frequency comparator configured to determine for comparison the frequency of the oscillator during the nominal voltage and current conditions and during the enhanced stress conditions of the MOS device.

4. The apparatus of claim 1, wherein the oscillator is a ring oscillator and the stages comprise complementary CMOS pairs functioning as inverters, the inverters having a threshold input voltage and a characteristic output parallel capacitance.

5. The apparatus of claim 4, wherein the bias control circuit coupled to supply the oscillator comprises at least one CMOS transistor having a base coupled to the junction and a drain and source coupled between the CMOS pairs of the inverters and one of two terminals that provide a potential difference for powering the oscillator.

6. The apparatus of claim 5, wherein the MOS device of the first polarity forms a device under test to be one of aged and degraded by application of the enhanced stress conditions, and further comprising at least one of a second device under test and a control device for comparison.

7. The apparatus of claim 6, comprising at least one said control device for comparison, of a same polarity and associated with each of the first and second devices under test, and further comprising a switching network for switchably substituting the control device for comparison with its associated device under test during a phase in which the frequency comparator determines a frequency of the oscillator.

8. The apparatus of claim 6, comprising one said oscillator for each polarity of the first and second devices under test.

9. The apparatus of claim 8, further comprising at least one digital counter operable to count cycles of the oscillator over a predetermined time interval, and wherein the at least on counter determines the frequency of the oscillator during switched intervals for comparing changes in the frequency of the oscillator between at least two situations including at least one said device under test in nominal versus enhanced stress conditions, at least two distinct stress conditions provided by different source/drain and gate bias conditions, a fresh control device versus a previously degraded device under test, and a device under test before and after a period of recovery from stress.

10. An apparatus for monitoring degradation of a complementary metal oxide semiconductor (CMOS) circuit, comprising:

at least three metal oxide semiconductor (MOS) elements of which at least two MOS elements have a same polarity and are arranged substantially in parallel with one another, and in series with a third MOS element having a different polarity, wherein the third MOS element and a selectable one of the at least two MOS elements are switchably coupled between two bias voltages as a first complementary pair;

wherein one of the MOS elements of the same polarity provides a device under test be relatively more stressed, and another of the MOS elements of the same polarity provides a comparison device to be relatively unstressed, whereby operation of the stressed and unstressed MOS elements can be compared to discern effects of stress;

a switching network configured to select between the stressed and unstressed MOS elements in time divisions and to couple terminals of a selected one of the stressed and unstressed MOS elements to voltages causing the selected one of the stressed and unstressed MOS elements to produce a variable current determined partly by a level of stress, the switching network connecting to each of said stressed and unstressed MOS elements at different times;

at least one ring oscillator comprising a plurality of cascaded inverters coupled in a loop, wherein the inverters are coupled to bias voltages by at least one variable control element and the variable control element is responsive to the variable current produced by the selected one of the stressed and unstressed MOS elements, such that the ring oscillator produces a frequency that varies with said level of stress.

11. The apparatus according to claim 10, wherein the inverters comprise at least one complementary pair of MOS elements with gates coupled to an input, and a junction providing an output, wherein the output is coupled to a parallel capacitance that is charged by said variable current.

12. The apparatus according to claim 10, comprising at least second stressed and unstressed MOS elements of a polarity forming a second complementary pair of opposite polarity from the first complementary pair, the second complementary pair comprises one of two MOS elements of a same polarity to be stressed and unstressed elements of said opposite polarity and a third MOS element forming said second complementary pair with a switchably selected one of the stressed and unstressed elements of said opposite polarity, to produce a second variable current determined partly by a level of stress, the switching network connecting to each of said stressed and unstressed MOS elements of said opposite polarity at different times.

13. The apparatus according to claim 12, comprising a ring oscillator separately associated with each of the opposite polarities.

14. The apparatus according to claim 10, wherein stress produces variable leakage in the device under test.

15. The apparatus according to claim 10, wherein the switching network selects in time divisions gate, source and drain signals that produce at least in the stressed device at least one of HCI, NBTI, PBTI, TDDB.

16. The apparatus according to claim 10, wherein the switching network selects in time divisions gate, source and drain signals that produce HCI, TDDB, NBTI in a PMOS element and PBTI in an NMOS element.

17. The apparatus according to claim 10, further comprising a least one digital counter operable to accumulate a count from the ring counter in selected ones of the time divisions for comparison with a count in selected other ones of the time divisions.

18. The apparatus according to claim 10, further comprising at least two digital counter during at least selected ones of the time divisions and the other of the counters being operable to time a predetermined interval.

19. A method for assessing operating characteristics of metal oxide semiconductor devices, comprising:

coupling a metal oxide semiconductor (MOS) device having a first polarity into a switching network operable to couple to the MOS device selected combinations drain/source bias and gate input voltage, and applying to the MOS device selected combinations of drain/source and gate voltages that model nominal levels of operation and enhanced stress conditions;

deriving from said MOS device a control signal that varies with a level of temporary or permanent degradation of operating characteristics of the MOS device;

operating a controllable oscillator to develop a frequency as a function of the control signal;

testing the MOS device under the nominal levels of operation and under the enhanced stress conditions repetitively in distinct time divisions; and, inferring from differences in frequency of the oscillator during said time divisions a measure of degradation of the operating characteristics of the MOS device.

20. The method of claim 19, wherein the MOS device is coupled in a complementary pair with an MOS device having an opposite polarity, and the control signal is derived from a current at a junction of the complementary pair, which current varies with leakage of the MOS device associated with at least one of HCI, NBTI, PBTI, TDDB, and further comprising applying the current signal to control the frequency of a ring oscillator by varying a bias level applied to the ring oscillator.

* * * * *

UNITED STATES PATENT AND TRADEMARK OFFICE
CERTIFICATE OF CORRECTION

PATENT NO. : 8,692,571 B2  
APPLICATION NO. : 13/183521  
DATED : April 8, 2014  
INVENTOR(S) : Fang-Shi Jordan Lai et al.

Page 1 of 1

It is certified that error appears in the above-identified patent and that said Letters Patent is hereby corrected as shown below:

In the Claims

Claim 18, Column 16, Line 67, after the word "digital" insert -- counters, one of the counters being operable to accumulate a count from the ring --

Signed and Sealed this  
Sixth Day of January, 2015

Michelle K. Lee  
*Deputy Director of the United States Patent and Trademark Office*